(12) United States Patent
Hanawa

(10) Patent No.: US 6,731,375 B2
(45) Date of Patent: May 4, 2004

(54) PROJECTION ALIGNER, EXPOSING METHOD AND SEMICONDUCTOR DEVICE

(75) Inventor: Tetsuro Hanawa, Kanagawa (JP)

(73) Assignee: Semiconductor Leading Edge Technologies, Inc., Kanagawa (JP)

( * ) Notice: Subject to any disclaimer, the term of this patent is extended or adjusted under 35 U.S.C. 154(b) by 83 days.

(21) Appl. No.: 09/986,353

(22) Filed: Nov. 8, 2001

(65) Prior Publication Data
US 2002/0076628 A1 Jun. 20, 2002

(30) Foreign Application Priority Data
Dec. 14, 2000 (JP) ........................................ 2000-380661

(51) Int. Cl.$^7$ .............................................. G03B 27/54
(52) U.S. Cl. ........................................................ 355/67
(58) Field of Search .............................. 356/399–401; 355/53, 67, 68

(56) References Cited

U.S. PATENT DOCUMENTS 5,363,171 A  * 11/1994  Mack ........................... 355/68
5,581,324 A  * 12/1996  Miyai et al. ................... 355/53
5,721,608 A  *  2/1998  Taniguchi ...................... 355/53
6,002,467 A  * 12/1999  Nishi et al. .................... 355/61

FOREIGN PATENT DOCUMENTS

| JP | 63-187625 | 8/1988 |
| JP | 63-250118 | 10/1988 |
| JP | 02-025852 | 1/1990 |
| JP | 2-209719 | 8/1990 |
| JP | 5-57838 | 7/1993 |
| JP | 5-206000 | 8/1993 |
| JP | 5-315217 A | 11/1993 |
| JP | 10-12533 A | 1/1998 |
| JP | 2000-031015 | 1/2000 |

* cited by examiner

Primary Examiner—Rodney Fuller
Assistant Examiner—D. Ben Esplin
(74) Attorney, Agent, or Firm—Foley & Lardner

(57) ABSTRACT

In the present invention, a substrate with exposure light from an exposure light source is irradiated before a projection exposure beforehand. A reflectance of this exposure light from the substrate is measured. An appropriate intensity of exposure light for the substrate is determined by referring to the reflectance. Then, a mask pattern is projected onto the substrate by irradiating with exposure light of the determined intensity.

9 Claims, 7 Drawing Sheets

7c: resist:5000±100 Å
7b: SiN:1000±100 Å
7a: Si substrate
7 : wafer

7c: resist:5000±100Å
7b: SiN:1000±100Å
7a: Si substrate
7 : wafer

PROJECTION ALIGNER, EXPOSING METHOD AND SEMICONDUCTOR DEVICE

BACKGROUND OF THE INVENTION

1. Field of the Invention

The present invention relates to a projection aligner used in semiconductor device fabrication processes to project a mask pattern onto a substrate, a projection exposure method using the projection aligner, and a semiconductor device.

More specifically, the present invention relates to the structure and use of a projection aligner capable of reducing variations in the dimensions and the shapes of resist patterns caused due to variations in the thickness and physical properties of films formed on a substrate.

2. Background Art

A typical example to which the present invention is applied is the projection aligner used when fine circuit patterns are formed on a substrate in a photoengraving process. The present invention will be described below using a reduction projection aligner as an example.

FIG. 3 is a sectional view of a reduction projection aligner.

Referring to FIG. 3, reference numeral 1 denotes an exposure light source; 2 a fly-eye lens; 3 a σ aperture; 3A a reflector; 3B a condenser lens; 4 a reticle; 5 a projection optical system; and 7 a wafer which is a substrate. Generally, exposure light emitted from the exposure light source 1 goes through the fly-eye lens 2, the σ aperture 3, and the condenser lens 3B, illuminates the reticle 4, and reaches the wafer 7 after being condensed by the projection optical system 5, thereby forming a resist pattern on the surface of the wafer 7.

In recent years, with the high integration and miniaturization of semiconductor device circuit patterns, exposure devices used in the process of projecting and exposing a mask pattern onto a semiconductor substrate have employed higher resolutions by reducing the wavelengths of the exposure light and increasing the aperture number (NA) of the reduction projection lens. Currently, a projection aligner whose aperture number (NA) is no less than 0.7 is almost put into practical use, using ArF excimer laser light as an exposure light source.

However, the focal depth becomes shallow as the wavelength of the exposure light is reduced and the aperture number (NA) of the reduction projection lens is increased to enhance the resolution. As a result, the process variation tolerance is reduced.

Therefore, to faithfully and accurately form fine patterns on a substrate, the Chemical Mechanical Polishing technique, etc. is applied to enhance the flatness of the wafer. As the projection aligner, a scan-type projection aligner is adopted which performs an exposure while following the uneven surfaces of the substrate by use of data obtained through information sent from a pre-read focus sensor. Additionally, effort has been done with regard to the projection aligner to improve measurement accuracy thereof.

On the other hand, since the focal depth has recently become shallow and, as a result, the process variation tolerance has been reduced, as described above, variations in the dimensions and the shapes of resist patterns are affected by variations in the thickness of resist films and films formed on a substrate.

These variations will be specifically described with reference to FIGS. 4 through 6. FIGS. 4 through 6 are graphs showing the relationships among the thickness of an SiN film 7b, the thickness of a resist film 7c, and the reflectance of an wafer 7.

FIG. 4 shows a case in which the SiN film 7b is deposited on the Si substrate 7a to a thickness of 1000 Å and the KrF resist 7c is further coated thereon to a thickness of 5000 Å. FIG. 4 indicates changes in the reflectance of the KrF excimer laser light from the wafer 7 with changes in each film thickness. In FIG. 4, the horizontal axis indicates the thickness of the SiN film 7b, while the vertical axis indicates the thickness of the resist film 7c. Changes in the reflectance of the wafer 7 are expressed by use of contour lines.

It is considered that the actual thickness of an SiN film varies by ±10%, while the thickness of a resist film varies by ±50 Å. Accordingly, in FIG. 4, the thickness of the SiN film 7b changes from 900 Å to 1100 Å, while the thickness of the resist film 7c changes from 4950 Å to 5050 Å. As indicated in the figure, the reflectance of the wafer 7 considerably changes with changes in the thickness of the SiN film 7b and the resist film 7c.

FIG. 5 is a graph showing changes in the reflectance of KrF excimer laser light from the wafer 7 with changes in the thickness of the SiN film 7b when the thickness of the resist film 7c is fixed. In FIG. 5, the horizontal axis indicates the thickness of the SiN film 7b, while the vertical axis indicates the reflectance of wafer 7. Assume that the actual thickness of an SiN film varies by ±10%. As can be seen from FIG. 5, the reflectance of the wafer 7 changes from 18% to 52%.

FIG. 6 is a graph showing changes in the reflectance of KrF excimer laser light from the wafer 7 with changes in the thickness of the resist film 7c when the thickness of the SiN film 7b is fixed. In FIG. 6, the horizontal axis indicates the thickness of the resist film 7c, while the vertical axis indicates the reflectance of the wafer 7. On a flat substrate, the thickness of a resist film can be controlled so that it is within a set value ±50 Å. Accordingly, as can be seen from FIG. 6, the reflectance of the wafer 7 changes from 32% to 49%.

Incidentally, the reflectance of a substrate is inversely proportional to the amount of energy absorbed into the resist. That is, as the reflectance of the substrate becomes higher, a smaller amount of energy is absorbed into the resist. This means that in the case of the positive resist, the amount of sensed light decreases.

Specifically, as shown in FIG. 7, when the reflectance of the wafer 7 is higher than the reference reflectance for setting exposure amounts, the dimensions of formed resist patterns increase. When the reflectance of the wafer 7 is lower than the reference reflectance for setting exposure amounts, the dimensions of formed resist patterns decrease.

SUMMARY OF THE INVENTION

As described above, variations in the dimensions and the shapes of resist patterns are affected by variations in the thickness of the resist film and the films formed on a substrate. Of these variations, the variation in the thickness of the resist film can be reduced by flattening the wafer, which is done as a measure to cope with the shallowed focal depths. Accordingly, it is important to control the thickness and the physical properties of the film formed under the resist film on the substrate in order to reduce dimensional variations in resist patterns caused due to variations in the reflectance of the substrate.

However, since it is difficult to control variations in the thickness and the physical properties over the entire wafer surface, between wafers, or between lots, an antireflective coating is applied under the resist film and to the uppermost layer of the substrate in order to reduce influence of the reflection from the substrate. On the projection aligner side, on the other hand, such measures as adoption of a method for controlling exposure amounts, and reduction of uneven illumination may be applied.

However, to apply the antireflective film, it is necessary to add a step of antireflective film etching in the dry etching process after photolithography, which reduces dimensional controllability of the resist patterns. Furthermore, forming of the antireflective film increases the production cost as well as reducing the processing capability.

In order to solve the above problems, the present invention faithfully and accurately projects and exposes patterns which have been becoming highly dense and fine. Specifically, the present invention reduces variations in the dimensions and the shapes of resist patterns at low cost without lowering the processing capability and the dimensional controllability at the time of dry etching.

One aspect of the present invention is a projection aligner for projecting a mask pattern for fabrication of a semiconductor device onto a substrate to be processed. The projection aligner comprises a reflectance measuring mechanism for irradiating a substrate to be processed with exposure light and measuring a reflectance of the exposure light from the substrate to be processed, and a control mechanism for adjusting an intensity of the exposure light to a predetermined intensity by referring to the measured reflectance.

According another aspect of the present invention, in a projection exposure method, a substrate to be processed is irradiated with exposure light from an exposure light source. A reflectance of the exposure light from the substrate to be processed is measured. An appropriate intensity of exposure light for the substrate to be processed is determined based on the reflectance, and then a mask pattern is projected onto the substrate to be processed by irradiating with exposure light of the determined intensity.

Another aspect of the present invention is a semiconductor device fabricated by use of the projection exposure method according to the methods of the present invention.

Other and further objects, features and advantages of the invention will appear more fully from the following description.

DESCRIPTION OF THE PREFERRED EMBODIMENTS

Preferred embodiments of the present invention will be described with reference to the accompanying drawings. It should be noted that the same or corresponding components in the figures are denoted by like numerals to simplify or omit the descriptions.

First Embodiment

A first embodiment of the present invention is outlined as follows. In the first embodiment, a portion of an exposure light emitted from an exposure light source is branched to a substrate. The reflectance of this branched light from the substrate is measured. According to this measured reflectance, an optimum exposure light intensity at which to perform a projection exposure is obtained. With this arrangement, it is possible to reduce variations in the dimensions and the shapes of resist patterns caused due to variations in the thickness and properties of films formed on a substrate.

The first embodiment will be specifically described with reference to FIGS. 1 and 2.

Figure 1:
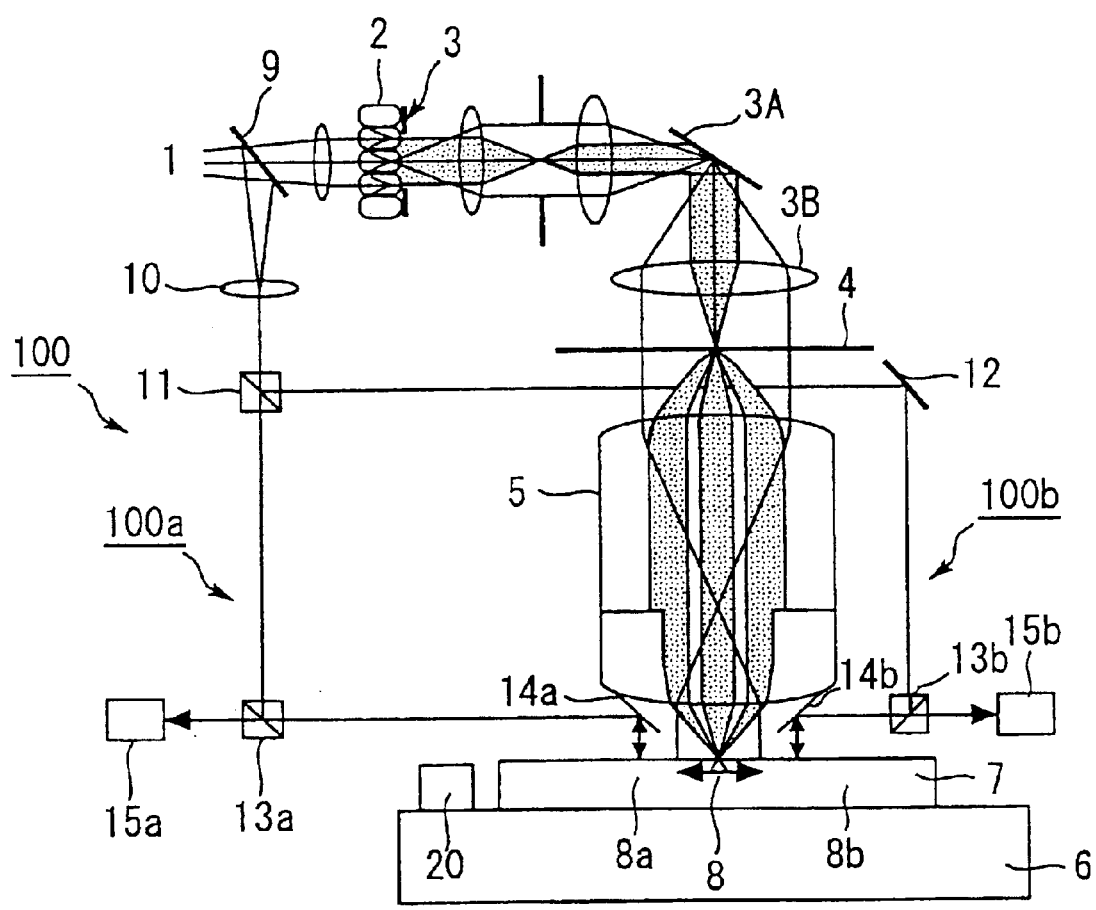
FIG. 1 is a schematic diagram showing a reduction projection aligner according to a first embodiment of the present invention.
Figure 2:
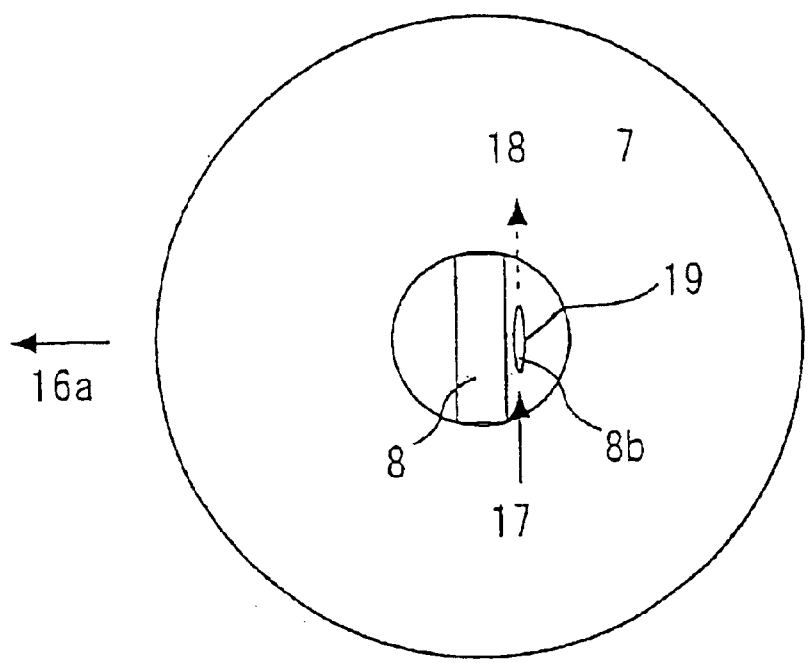
FIG. 2 is a diagram for illustrating a method of calculating a substrate reflectance according to the first embodiment of the present invention.
Figure 2:
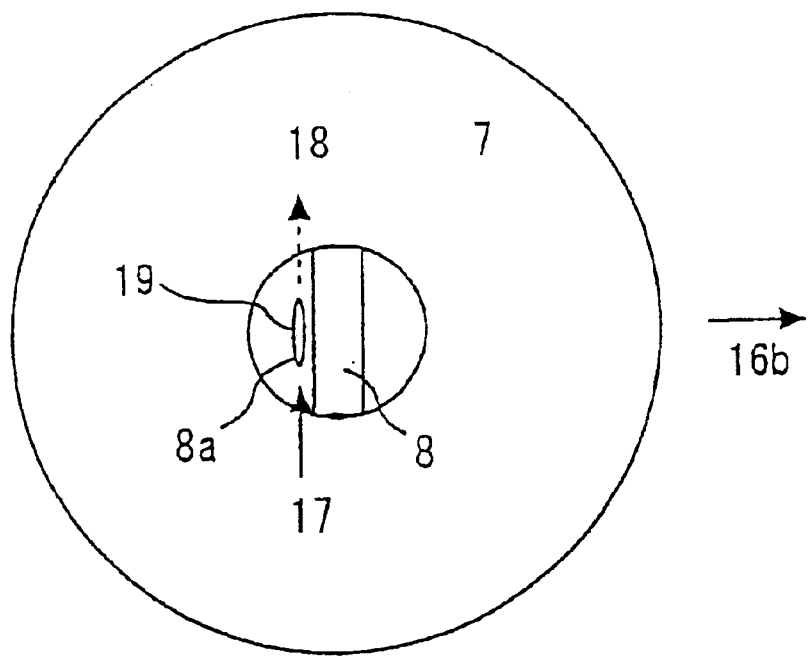
Figure 3:
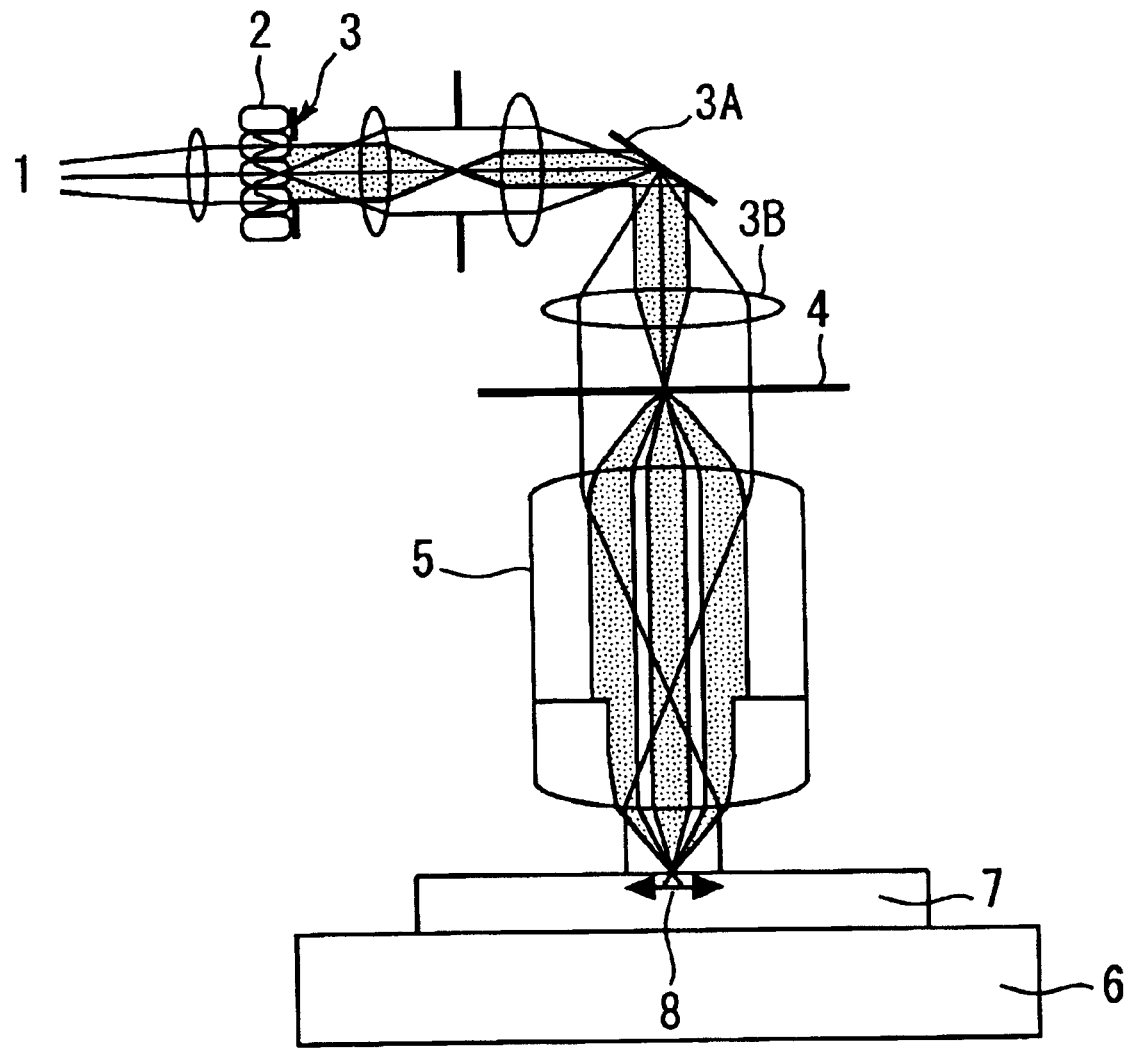
FIG. 3 is a schematic diagram showing a conventional reduction projection aligner.
Figure 4:
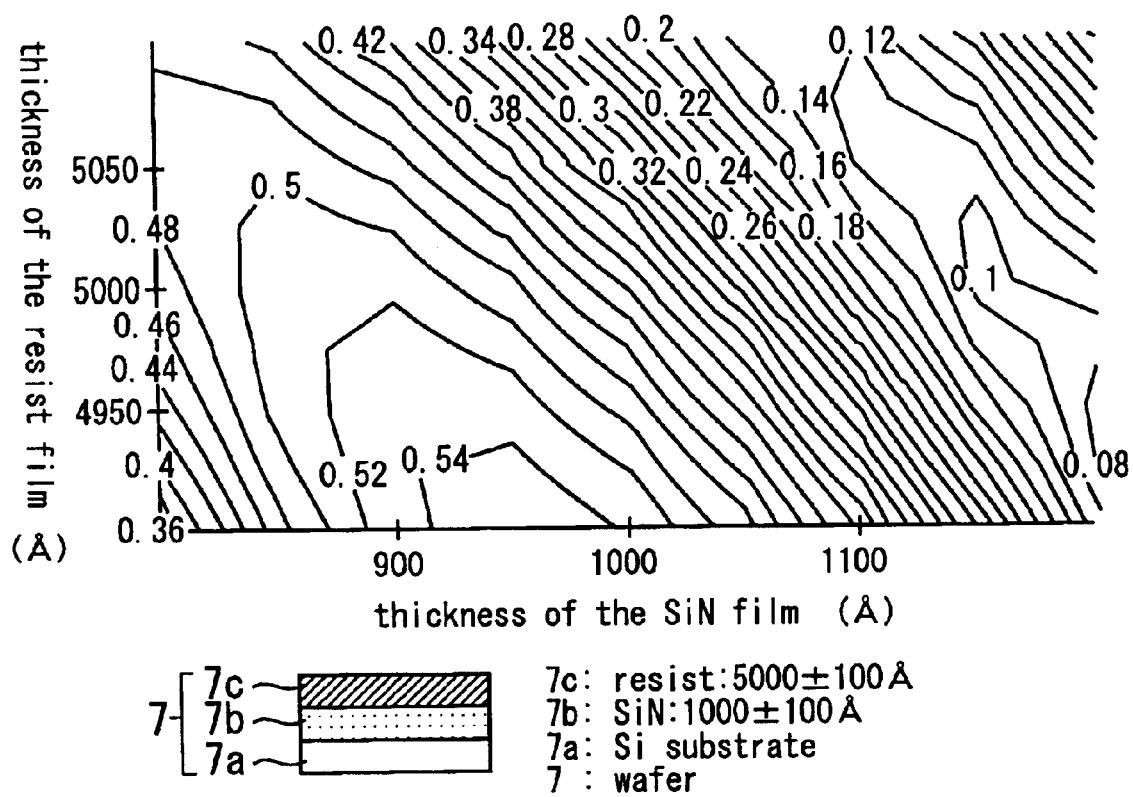
FIG. 4 is a graph indicating variations in a substrate reflectance with variations in the thickness of a resist film and a SiN film.
Figure 5:
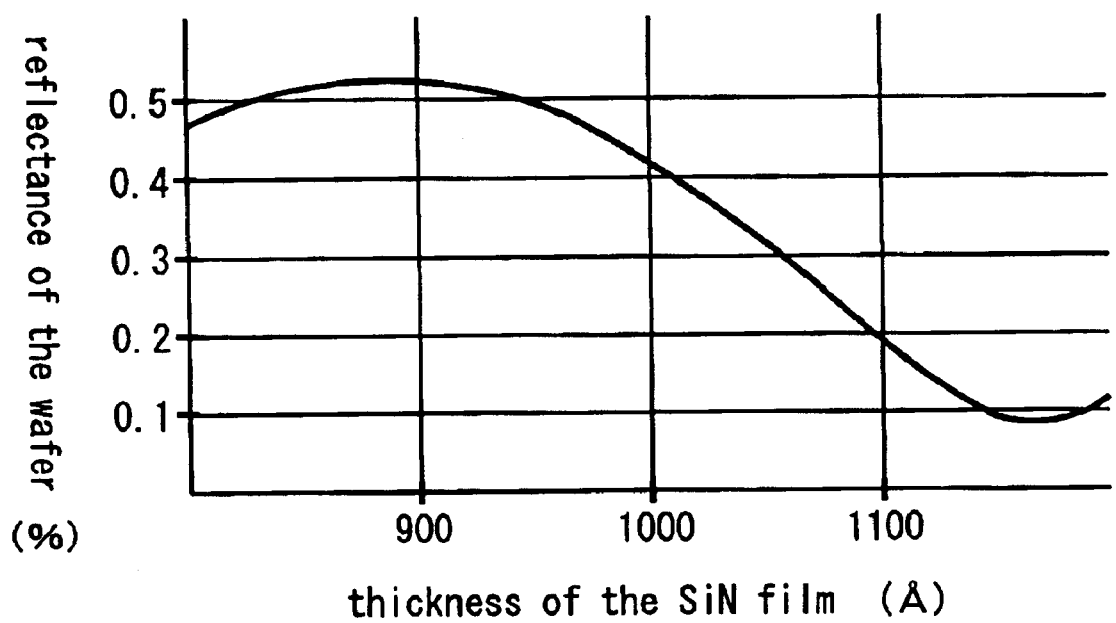
FIG. 5 is a graph indicating variations in a substrate reflectance with variations in the thickness of a SiN film.
Figure 5:
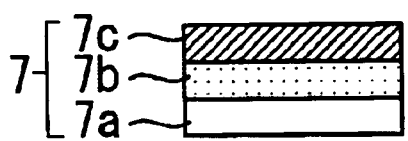
Figure 6:
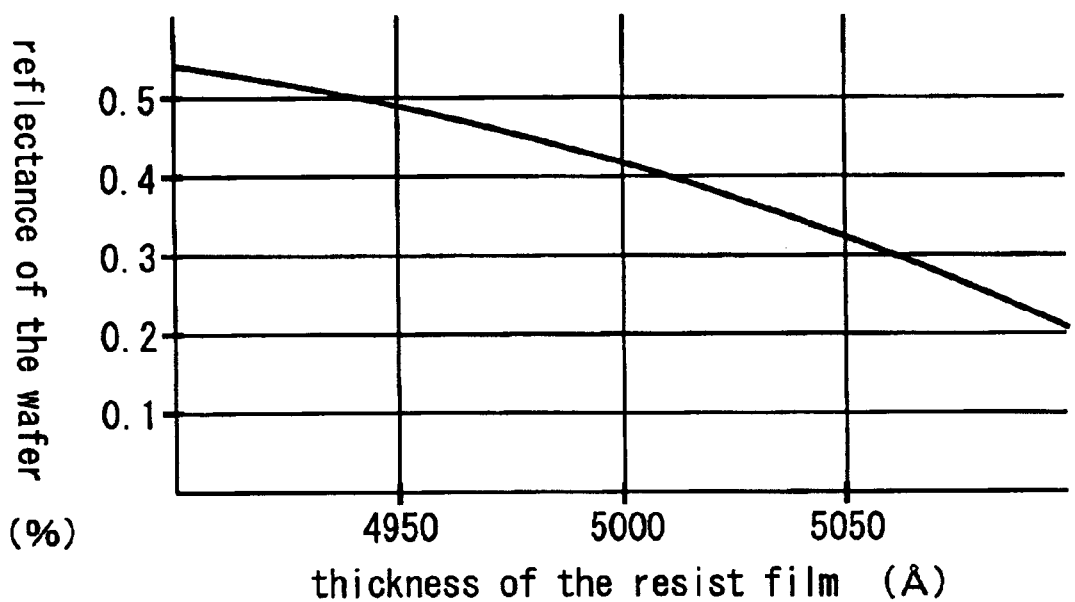
FIG. 6 is a graph indicating variations in a substrate reflectance with variations in the thickness of a resist film.
Figure 6:
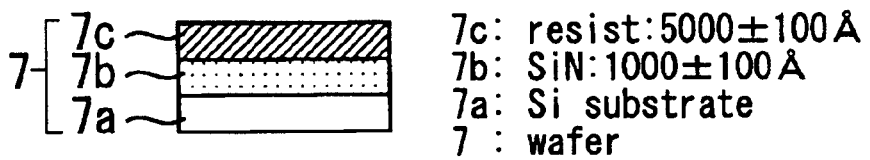
Figure 7:
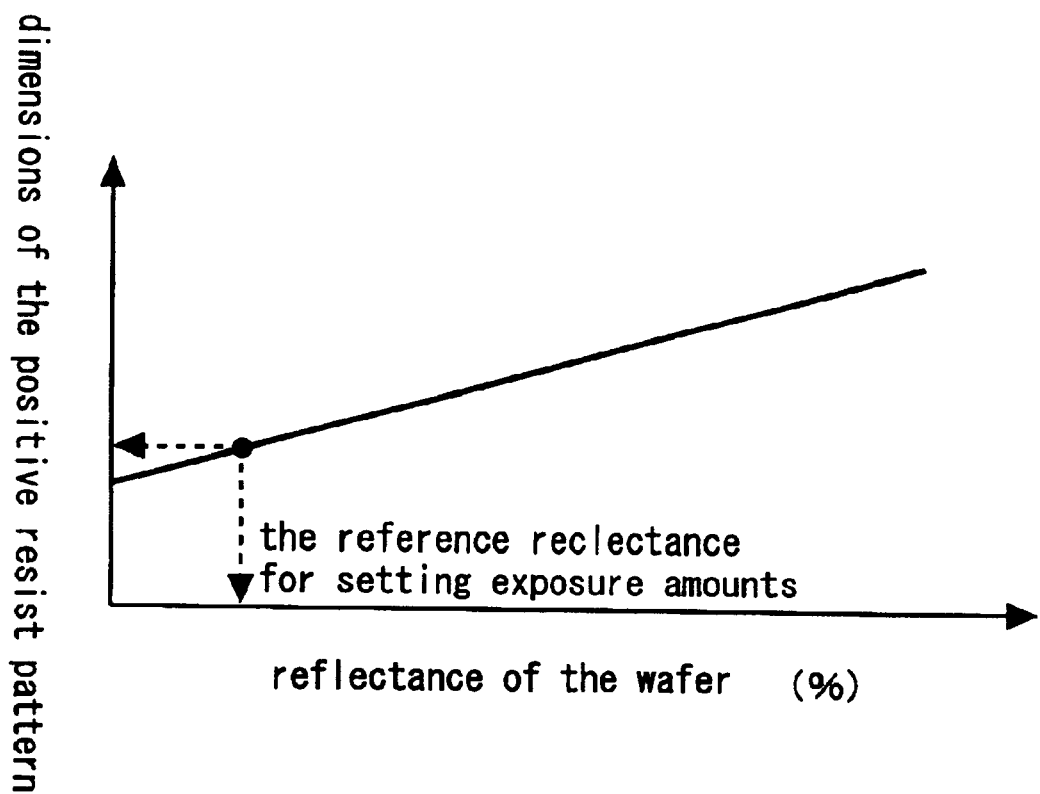
FIG. 7 is a graph indicating the relationship between a substrate reflectance and the dimension of a positive-type resist.

FIG. 1 schematically shows a reduction projection aligner used to form fine resist patterns for fabricating semiconductor devices according to the first embodiment of the present invention.

Referring to FIG. 1, reference numeral 1 denotes an exposure light source; 2 a fly-eye lens; 3 a σ aperture; 3A a reflector; 3B a condenser lens; 4 a reticle; and 5 a projection optical system. Furthermore, reference numeral 7 denotes a wafer which is a substrate and is supported on a supporting table called a wafer stage 6. Reference numeral 8 denotes an exposure area on the wafer 7.

Exposure light emitted from the exposure light source 1 goes through the fly-eye lens 2 and the σ aperture 3, and illuminates the reticle 4. The size of a mask pattern on the reticle 4 is reduced by a factor of 4 to 5, and focused on the exposure area 8 on the surface of the wafer 7, forming the desired resist pattern on the surface of the wafer 7.

Generally, a high-pressure mercury lamp or an excimer laser is used as the exposure light source 1. Excimer lasers used for this purpose include KrF, ArF, and F2 whose wavelengths are 248 nm, 193 nm, and 157 nm, respectively. However, the present invention is not limited to these specific excimer lasers.

Referring to FIG. 1, reference numeral 9 denotes a half mirror. Reference numeral 10 denotes an optical system which shapes incident light and also functions as an adjuster for attenuating its intensity. Furthermore, reference numeral 11 indicates a beam splitter. Light passed through the optical system (adjuster) 10 is branched both downward and horizontally. Reference numeral 12 denotes a reflector; 13a and 13b half mirrors; 14a and 14b deflecting mirrors; and 15a and 15b reflectance detectors. The reflectance detectors 15a and 15b are each provided with a light intensity measuring sensor for measuring the intensity of respective reflected light. The reflectance can be calculated from a measurement obtained by use of the light intensity measuring sensor.

The half mirror 13a is placed below the beam splitter 11 so as to receive the downward light from the beam splitter 11. The reflector 12 is placed in the horizontal direction from the beam splitter 11 so as to receive the horizontal light from the beam splitter 11. Furthermore, the half mirror 13b is placed below the reflector 12.

Further, the half mirrors 13a and 13b, the deflecting mirrors 14a and 14b, and the reflectance detectors 15a and 15b are placed on a straight line in the horizontal direction so that light beams reflected from the half mirrors 13a and 13b can enter the reflectance detectors 15a and 15b by way of the deflecting mirrors 14a and 14b, respectively. The deflecting mirrors 14a and 14b are located right over exposure adjacent areas 8a and 8b respectively.

Furthermore, reference numeral 20 denotes a reference reflection board used as a reference for measuring the reflectance of the substrate.

A reflectance measuring mechanism 100 is made up of the half mirror 9, the optical system (adjuster) 10, the beam splitter 11, the reflector 12, the half mirrors 13a and 13b, the deflecting mirrors 14a and 14b, the reflectance detectors 15, and the reference reflection board 20.

A reflectance measuring system 100a is made up of the half mirror 9, the optical system (adjuster) 10, the beam splitter 11, the reflector 13a, the deflecting mirror 14a, the reflectance detector 15a, and the reference reflection board 20. A reflectance measuring system 100b, on the other hand, is made up of the half mirror 9, the optical system (adjuster) 10, the beam splitter 11, the reflector 12, the half mirror 13b, the deflecting mirror 14b, the reflectance detector 15b, and the reference reflection board 20.

A projection exposure method using the reduction projection aligner configured as described above will be described below with reference to FIG. 1.

Referring to FIG. 1, exposure light emitted from the exposure light source 1 reaches the half mirror 9, from which a portion of exposure light is reflected downward, branching from the remaining exposure light. This branched light enters the optical system (adjuster) 10, which shapes it into an elliptic shape as well as attenuating it so that light intensity on the surface of the wafer 7 is $\frac{1}{100}$ to $\frac{1}{10000}$ of that on the exposure area 8. Furthermore, the branched light goes through the beam splitter 11 which further branches it into two light beams: a downward light beam and a horizontal light beam.

The light branched downward reaches the half mirror 13a and is reflected horizontally. The light then illuminates the exposure adjacent area 8a adjacent to the exposure area 8 on the wafer 7 at a right angle by way of the deflecting mirror 14a. The light reflected from the wafer 7 as a result of this illumination is introduced to the reflectance detector 15a by way of the deflecting mirror 14a again. The reflectance detector 15a measures the intensity of the reflected light which is of the exposure light branched downward and which is reflected from the wafer 7.

The light branched horizontally is reflected downward by the reflector 12. This reflected light reaches the half mirror 13b and is reflected horizontally. The light then illuminates the exposure adjacent area 8b by way of the deflecting mirror 14b. The light reflected from the wafer 7 as a result of this illumination is introduced to the reflectance detector 15b by way of the deflecting mirror 14b again. The reflectance detector 15b measures the intensity of the reflected light which is of the exposure light branched horizontally and which is reflected from the wafer 7.

Description will be made of a means for calculating the reflectance of the measured intensity of the reflected light. The reference reflection board 20 is mounted on the stage 6. The reference reflection board 20 is irradiated with exposure light immediately before the wafer 7 is conveyed onto the wafer stage 6. The intensity of the reflected light of the exposure light reflected from the reference reflection board 20 is measured, and the result is input to the reflectance detectors 15a and 15b beforehand. By using this result as a reference, the reflectance detectors 15a and 15b calculate the reflectance from the measured intensity of the reflected light from the wafer 7.

It should be noted that the present invention is not limited to the above specific method for calculating the reflectance. Other methods may be used.

The optimum intensity of exposure light for the exposure adjacent area 8a or 8b is determined by referring to relationships between reflectances and their optimum exposure amounts obtained for each type of resist, each product, or each process by use of outputs from the reflectance detector 15a or 15b, beforehand.

The exposure adjacent area 8a or 8b is irradiated with exposure light of the determined intensity at the time of projecting and exposing a mask pattern. With this arrangement, it is possible to reduce variations in the dimensions and the shapes of resist patterns caused due to the difference between an optimum exposure amount and an actual exposure amount caused due to variations in the thickness and the properties of the wafer 7.

FIG. 2(b) is a schematic diagram illustrating a case in which a reflectance of the exposure adjacent area 8a is measured by use of the reflectance measuring system 100a, while FIG. 2(a) is a schematic diagram illustrating a case in which a reflectance of the exposure adjacent area 8b is measured by use of the reflectance measuring system 100b.

According to the first embodiment, as shown in FIG. 1, incident light is branched into two light beams by the beam splitter 11, and the two reflectance measuring systems 100a and 100b are provided. The reflectance measuring mechanism 100 includes the reflectance measuring systems 100a and 100b. The reflectance measuring system 100a is a mechanism for measuring the reflectance of the exposure adjacent area 8a, while the reflectance measuring system 100b is a mechanism for measuring the reflectance of the exposure adjacent area 8b.

FIG. 2(a) is a schematic diagram illustrating a case in which a reflectance of the exposure adjacent area 8a is measured by use of the reflectance measuring system 100a, while FIG. 2(b) is a schematic diagram illustrating a case in which a reflectance of the exposure adjacent area 8b is measured by use of the reflectance measuring system 100b.

Whether the reduction projection aligner is of a stepper type or of a scanner type, there are two traveling directions (the traveling direction 16a and the traveling direction 16b) of the wafer stage 6 with respect to the projection lens 5 in order to minimize the processing time.

As shown in FIG. 2(a), when the wafer stage 6 travels in the traveling direction 16a, the present exposure adjacent area is the exposure adjacent area 8b, and therefore the reflectance is measured by the reflectance measuring system 100b.

On the other hand, as shown in FIG. 2(b), when the wafer stage 6 travels in the traveling direction 16b, the present exposure adjacent area is the exposure adjacent 8a, and therefore the reflectance is measured by the reflectance measuring system 100a.

With this arrangement, it is possible to accommodate both traveling directions of the wafer stage 6, that is, the traveling directions 16a and 16b, minimizing the processing speed.

Furthermore, according to the first embodiment, by way of the reflectors 14a or 14b, the incident light 17 arrives at the exposure adjacent area 8a or 8b, which is about 0.5 mm to 3 mm away from the exposure area 8. Thus, when a projection exposure is performed on the exposure area 8, the reflectance of the exposure adjacent area 8a or 8b adjacent to it is also measured at the same time. With this arrangement, it is possible to minimize the processing time. However, the present embodiment is not limited to the above specific arrangement. Anything which can be used to obtain a reflectance can be employed.

Furthermore, according to the first embodiment, to average the reflectance information from the wafer 7, the optical system 10 shapes the shape of the branched incident light 17 into an elliptical shape 19 having a short diameter width of 0.5 to 2 mm and a long diameter width of 0.5 to 26 mm. However, the present invention is not limited to this specific shape. Other shapes may be used. It should be noted that the averaging of reflectance information is carried, out to avoid improper setting of an exposure amount, which occurs when a singularity in the reflectance is irradiated with the incident light 17.

Further, the first embodiment uses a single light beam as the incident light 17. However, the present invention is not limited to a single light beam. A plurality of beams may be employed to achieve averaging of reflectance information from the wafer 7.

Further, even though the first embodiment assumes that the incident light 17 is incident to the wafer 7 at a right angle, the present invention is not limited to this specific arrangement. It may be arranged that the wafer 7 is irradiated with the incident light 17 at another angle, and the reflected light 18 is introduced to the reflectance detector by use of an optical system different from that used for the incident light.

Second Embodiment

A projection aligner according to a second embodiment of the present invention has a structure similar to that shown in FIG. 1.

However, the second embodiment employs a high-pressure mercury lamp as the exposure light source. Furthermore, this projection aligner has a control mechanism capable of adjusting the intensity of the exposure light by changing the illumination of the illumination system. With this arrangement, it is possible to realize a projection exposure using exposure light of an optimum intensity according to reflectance measurement results. Since the other components are the same as those shown in FIG. 1, their explanation will be omitted.

Third Embodiment

A projection aligner according to a third embodiment of the present invention also has a structure similar to that shown in FIG. 1.

However, the third embodiment employs a pulse light source such as an excimer laser. Furthermore, this projection aligner has a control mechanism capable of adjusting the intensity of the exposure light by changing the interval between pulse light emissions. With this arrangement, it is possible to realize a projection exposure using exposure light of an optimum intensity according to reflectance measurement results. Since the other components are the same as those shown in FIG. 1, their explanation will be omitted.

Fourth Embodiment

A projection aligner according to a fourth embodiment of the present invention also has a structure similar to that shown in FIG. 1.

However, the fourth embodiment employs a scan-type projection aligner. Furthermore, this projection aligner has a control mechanism capable of adjusting the intensity of the exposure light by changing the scan speed of the wafer stage 6, which moves the wafer 7 against the projection lens 5. With this arrangement, it is possible to realize a projection exposure using exposure light of an optimum intensity according to reflectance measurement results. Since the other components are the same as those shown in FIG. 1, their explanation will be omitted.

The features and the advantages of the present invention as described above may be summarized as follows.

According to one aspect of the invention, in a projection aligner or a method of a projection exposure, an exposure area is irradiated with exposure light of low energy before a projection exposure beforehand, and the reflectance of a substrate for the exposure light is measured. Therefore, it is possible to determine an optimum intensity of exposure light according to local changes in the reflectance of the exposure light caused due to changes in the thickness and the properties of films formed on a substrate. Accordingly, by changing the intensity of exposure light to an optimum value as necessary according to the above method, variations in the dimensions and the shapes of resist patterns can be reduced at low cost without lowering the processing capability and the dimensional controllability at the time of dry etching.

In another aspect, in the projection aligner or a method of a projection exposure, it is possible to measure the reflectance of an exposure adjacent area at the time of performing a projection exposure on an exposure area by branching a portion of the exposure light at that time. Accordingly, resist patterns can be formed at low cost achieving high performance without reducing the processing capability.

In another aspect, in the projection aligner or a method of a projection exposure the branched portion of exposure light is further branched into two light beams, and a reflectance measuring mechanism including two reflectance measuring systems can be provided. Accordingly, it is possible to accommodate each of two traveling directions of a wafer stage and thereby employ a method for forming resist patterns at lower cost and with high processing capability.

In the projection aligner preferably the reflectance measuring mechanism may include an adjuster capable of adjusting an intensity of exposure light used for measurement of a reflectance, and a reflectance detector for measuring a reflectance of the exposure light from the substrate to be processed.

In the projection aligner, preferably the reflectance measuring mechanism may include an adjuster capable of adjusting an intensity of exposure light used for measurement of a reflectance, a beam splitter for branching the exposure light used for measurement of a reflectance, into two light beams, and two reflectance detectors each corresponding to a respective one of the two light beams.

In the projection aligner, preferably the reflectance measuring mechanism may include means or a branching system for branching a portion of exposure light emitted from an exposure light source, the portion of exposure light being used for measurement of a reflectance. A position at which a reflectance is to be measured may be selected in an area immediately before an exposure area on the substrate to be processed.

In the projection aligner, preferably the reflectance measuring mechanism may include an optical system for forming exposure light used for measurement of a reflectance, into a beam of a predetermined shape.

In the projection aligner, preferably the control mechanism may include means or a determining system for determining an intensity of appropriate exposure light from the measured reflectance based on data indicating relationships between reflectances and intensities of appropriate exposure light, said data being based on reflectance measuring results obtained by said reflectance measuring mechanism.

In the projection aligner, preferably the control mechanism may include means or a changing system for changing illumination of an illumination system which provides exposure light.

The projection aligner, further may comprise a pulse light source as an exposure light source. The control mechanism may include means or a changing system for changing an interval between pulse light emissions.

In the projection aligner, preferably the control mechanism may include means or a changing system for changing a scan speed of a stage for moving a substrate to be processed against exposure light.

In the projection exposure method, an exposure area of a substrate to be processed may be irradiated with exposure light beforehand, and a reflectance of the exposure light from the substrate to be processed may be measured, the exposure light having energy lower than that of exposure light at a time of a projection exposure.

In the projection exposure method, a portion of exposure light from an exposure light source may be branched at a time of projecting a mask pattern onto an exposure area. An area adjacent to the exposure area of the substrate to be processed may be irradiated with the branched light. And a reflectance of the branched light from the substrate to be processed may be measured.

In the projection exposure method, a portion of exposure light from an exposure light source may be branched at a time of projecting a mask pattern onto an exposure area. An area immediately before the exposure area of the substrate to be processed may be irradiated with the branched light. And a reflectance of the branched light from the substrate to be processed may be measured.

In the projection exposure method, a portion of exposure light from an exposure light source may be formed into a beam of a predetermined shape by use of an optical system. A substrate to be processed may be irradiated with the beam. And a reflectance of the beam from the substrate to be processed may be measured.

In the projection exposure method, a portion of exposure light may be branched from an exposure light source. The branched light further may be branched into two light beams. And a reflectance of a branched light beam selected from the two branched light beams may be measured, the selected branched light beam illuminating an area which is immediately before an exposure area and is determined based on a moving direction of a substrate.

In the projection exposure method, data indicating relationships between reflectances of a substrate to be processed and appropriate intensities of exposure light may be prepared and an appropriate intensity of exposure light at a time of an exposure may be determined by referring to the data based on reflectance measuring results.

In the projection exposure method, the substrate may be irradiated with exposure light of the appropriate intensity by changing illumination of the exposure light.

In the projection exposure method, the substrate may be irradiated with exposure light of the appropriate intensity by changing an interval between pulse light emissions of the exposure light.

In the projection exposure method, the substrate may be irradiated with exposure light of the appropriate intensity by adjusting a scan speed of a wafer stage on which the substrate to be processed is mounted.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2000-380661, filed on Dec. 14, 2000 including specification, claims, drawings and summary, on which the Convention priority of the present application is based, are incorporated herein by reference in its entirety.

What is claimed is:

1. A scanning projection aligner for projecting a mask pattern for fabrication of a semiconductor device onto a substrate, said scanning projection aligner comprising:

a reflectance measuring mechanism for irradiating an exposure adjacent area which is adjacent an exposure area of a substrate with exposure light and for measuring a reflectance of said exposure light from said exposure adjacent area when said mask pattern is projected onto said exposure area; and a control mechanism for adjusting an intensity of said exposure light which is irradiated onto said exposure adjacent area thereby projecting the mask pattern onto said exposure area at a predetermined intensity by referring to said measured reflectance.

2. The scanning projection aligner according to claim 1, wherein said reflectance measuring mechanism includes:

an adjuster capable of adjusting an intensity of exposure light used for measurement of a reflectance; and a reflectance detector for measuring a reflectance of said exposure light from said substrate.

3. The scanning projection aligner according to claim 1, wherein said reflectance measuring mechanism includes:

an adjuster capable of adjusting an intensity of exposure light used for measurement of a reflectance; and a beam splitter for branching said exposure light used for measurement of a reflectance, into two light beams; and two reflectance detectors each corresponding to a respective one of said two light beams.

4. The scanning projection aligner according to claim 1, wherein said reflectance measuring mechanism includes a branching system for branching a portion of exposure light emitted from an exposure light source.

5. The scanning projection aligner according to claim 1, wherein said reflectance measuring mechanism includes an optical system for forming exposure light used for measurement of a reflectance, into a beam of a predetermined shape.

6. The scanning projection aligner according to claim 1, wherein said control mechanism includes a determining system for determining an intensity of appropriate exposure light from said measured reflectance based on data indicating relationships between reflectances and intensities of appropriate exposure light.

7. The scanning projection aligner according to claim 1, wherein said control mechanism includes a changing system for changing illumination of an illumination system which provides exposure light.

8. The scanning projection aligner according to claim 1, further comprising:

a pulse light source as an exposure light source;

wherein said control mechanism includes a changing system for changing an interval between pulse light emissions.

9. The scanning projection aligner according to claim 1, wherein said control mechanism includes a changing system for changing a scan speed of a stage for moving a substrate against exposure light.

* * * * *